United States Patent [19]

Still et al.

[11] Patent Number: 4,499,579
[45] Date of Patent: Feb. 12, 1985

[54] PROGRAMMABLE LOGIC ARRAY WITH DYNAMIC TEST CAPABILITY IN THE UNPROGRAMMED STATE

[75] Inventors: David W. Still, Phoenix; Peter C. Economopoulos, Scottsdale, both of Ariz.

[73] Assignee: Honeywell Information Systems Inc., Phoenix, Ariz.

[21] Appl. No.: 474,070

[22] Filed: Mar. 10, 1983

[51] Int. Cl.³ .................. G01R 31/28; G06F 11/00
[52] U.S. Cl. .................. 371/15; 324/73 R; 371/25
[58] Field of Search .................. 371/15, 21, 25; 324/73 R, 73 AT; 364/716

[56] References Cited

U.S. PATENT DOCUMENTS

| | | | |
|---|---|---|---|
| 3,958,110 | 5/1976 | Hong et al. | 371/15 |
| 3,961,252 | 6/1976 | Eichelberger | 324/73 AT |
| 4,225,957 | 9/1980 | Doty, Jr. et al. | 371/15 |
| 4,380,811 | 4/1983 | Gotze et al. | 364/716 X |
| 4,435,805 | 3/1984 | Hsieh et al. | 371/25 |

OTHER PUBLICATIONS

J. C. Logue et al., PLA Test Enhancement, IBM Technical Disclosure Bulletin, vol. 23, No. 3, Aug. 1980, pp. 1116–1117.

*Primary Examiner*—Charles E. Atkinson
*Attorney, Agent, or Firm*—A. A. Sapelli; J. S. Solakian; L. J. Marhoefer

[57] ABSTRACT

The present invention relates to a dynamically testable programmable logic array in an unprogrammed state which adds some circuit components to the static test logic. The static test logic provides the capability to detect stuck-at faults at the input of each logic gate of the programmable logic array, and is inoperative during normal operation of the programmable logic array. The added circuit components cause selected inputs to the product array to partially enable the product array, whereby the remaining inputs to the product array are a function of the inputs to the programmable logic array, thereby providing the dynamic test capability.

6 Claims, 7 Drawing Figures

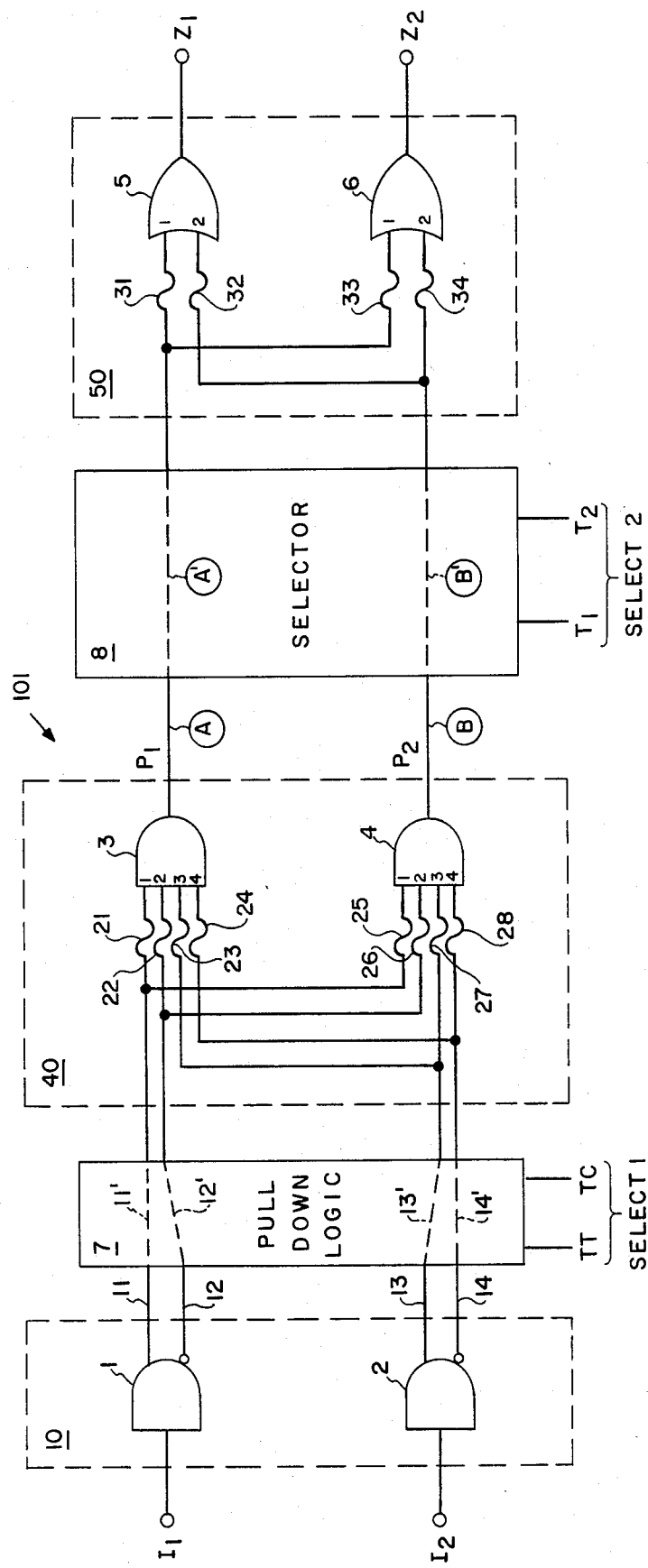
F I G. 2

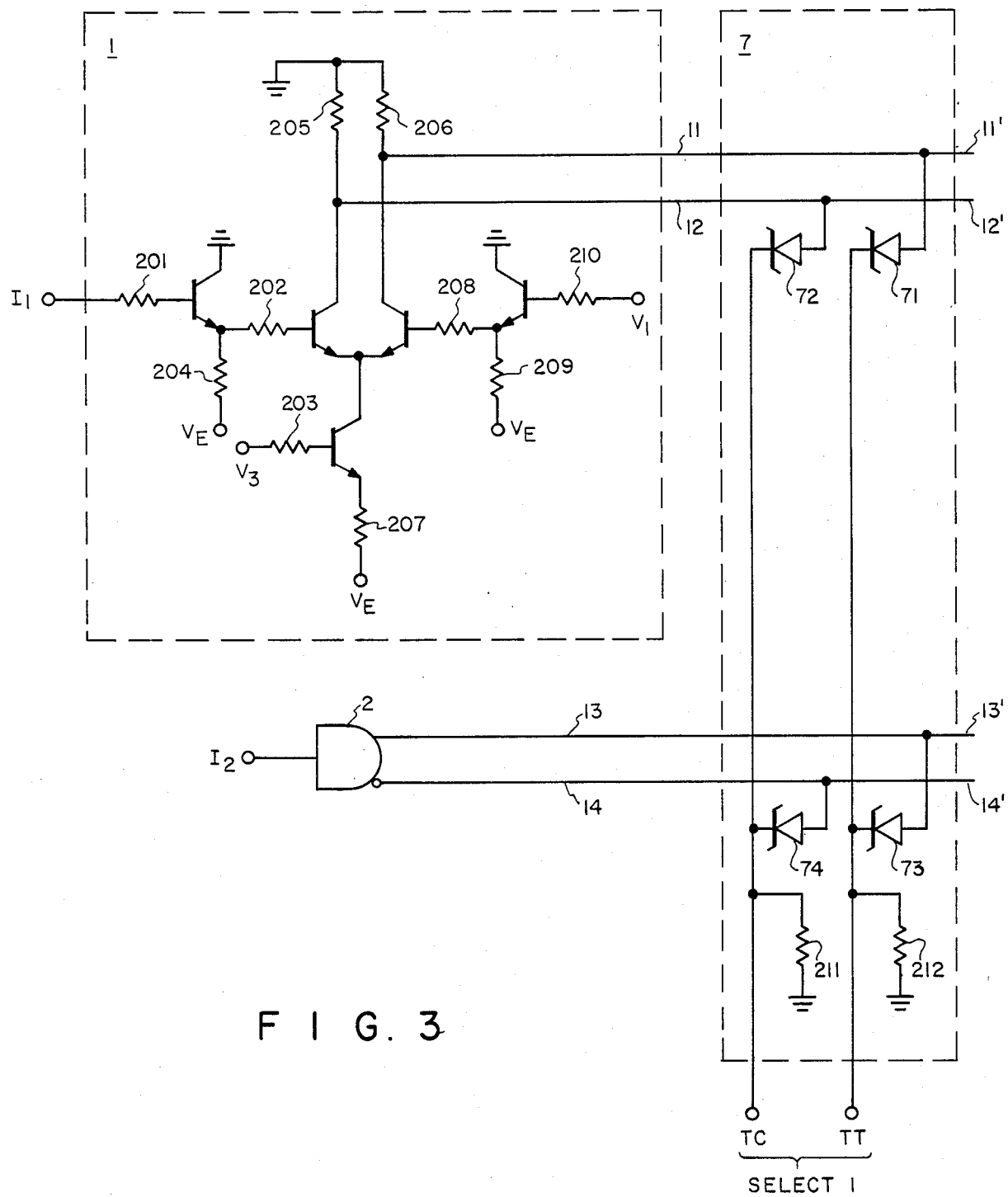
F I G. 3

PROGRAMMABLE LOGIC ARRAY WITH DYNAMIC TEST CAPABILITY IN THE UNPROGRAMMED STATE

RELATED APPLICATIONS

The present application is related to the following U.S. patent applications, which are assigned to Honeywell Information Systems Inc., the assignee of the present application, the references listed below being incorporated by reference herein:

(a) "Programmable Logic Array with Test Capability in the Unprogrammed State by David W. Still and Peter C. Economopoulos, Ser. No. 446,816 filed 12/3/82; and (b) "A Method of Programming a Programmable Logic Device by Vaporization of Metallized Links," by David W. Still and Peter C. Economopoulos, Ser. No. 451,134 filed 12/20/82.

BACKGROUND OF THE INVENTION

This invention relates to a logic circuit, and more particularly to the dynamic testability of a programmable logic array.

In the design of logic circuits, programmable logic arrays (PLA) have become increasingly more important for designing combinational logic circuits. These programmable logic arrays offer a greater variety and flexibility in logic design while lowering parts count and inventory requirements, and are also proving to be very cost effective. With programmable logic devices, a designer can customize a reliable, high volume integrated circuit to fit a specific application, and quickly.

However, until recently, little has been done to test the programmable logic array in the unprogrammed state. This is due in part to the unavailability of an adequate number of test points on the chip. The various testing techniques devised require augmenting the PLA with a substantially large amount of additional logic which can interfere with the normal operation of the PLA logic or which requires and dissipates additional power even while the PLA is operating normally.

The related application of paragraph (a) above presents a novel approach for providing static (or dc) test capability of a programmable logic array in the unprogrammed state with some small amount of added logic which is inoperative and dissipates no added power while the PLA is operating in its normal environment.

Presently, ac, or dynamic, testing is either not performed or is performed after the programmable logic array is programmed. Thus, it is apparent that ac testing of programmed programmable logic arrays (or devices) require individualized test procedures or routines. Since many programmed combinations may be available, the number of individualized test routines can be quite high.

Hence, it would be highly desirable to ac test a programmable logic array in an unprogrammed state. The present invention presents a novel approach for providing dynamic (or ac) test capability of a programmable logic array in the unprogrammed state. Some additional circuit components are added to the test logic of the programmable logic array to provide the dynamic test capability without comprising the static test capability.

SUMMARY OF THE INVENTION

Therefore, there is supplied a dynamically testable programmable circuit array, having a plurality of input terminals, each input terminal adapted to receive one of a plurality of input signals. The programmable circuit array comprises an input buffer, having a plurality of output terminals and inverted output terminals, the input buffer being operatively connected to the input terminal, which outputs equivalent input signals and inverted input signals, the equivalent input signals forming a first output group and the inverted input signal forming a second output group. The programmable circuit array also includes a programmable product array element which is operatively connected to the output terminals of the input buffer for generating a plurality of product terms. A programmable sum array element is included for combining the plurality of product terms to generate a plurality of sum terms, each of the plurality of sum terms being an output of the programmable circuit array. Test logic is also included which causes one of the output groups to have a predetermined logic state.

The product array element includes a plurality of AND gates, each AND gate coupled to receive a respective input signal, and each AND gate having associated therewith a fusible link. The sum array element includes a plurality of OR gates, each OR gate coupled to receive a respective product term, and each input of each OR gate having associated therewith a fusible link. An input buffer can also be included to provide the input signal and the complement of the input signal to the product array element. The output can include a plurality of exclusive-OR elements each exclusive-OR element coupled to a respective output, and each exclusive-OR element having a fusible link, thereby providing a programmable capability to the output signal whereby the output can be in a normal or inverted state.

Accordingly, it is an object of the present invention to provide a programmable logic array having test capability.

It is another object of the present invention to provide a programmable logic array having one hundred percent test capability.

It is still a further object of the present invention to provide a programmable logic device having dynamic test capability of the programmable logic device in the unprogrammed state.

It is still another object of the present invention to provide a programmable logic device having one hundred percent test capability for detecting stuck-at faults occurring at all the gate inputs of the programmable logic array chip.

It is still a further object of the present invention to provide a programmable logic device having dynamic test capability of the programmable logic device in the unprogrammed state without compromising the static test capability.

These and other objects of the present invention will become more apparent when taken in conjunction with the following description and attached drawings, wherein like characters indicate like parts, and which drawings form a part of the present application.

BRIEF DESCRIPTION OF THE DRAWINGS

FIG. 2 shows a functional logic diagram of a programmable logic array;

FIG. 3 shows a circuit diagram of an input buffer and pulldown logic;

DETAILED DESCRIPTION

Figure 1:
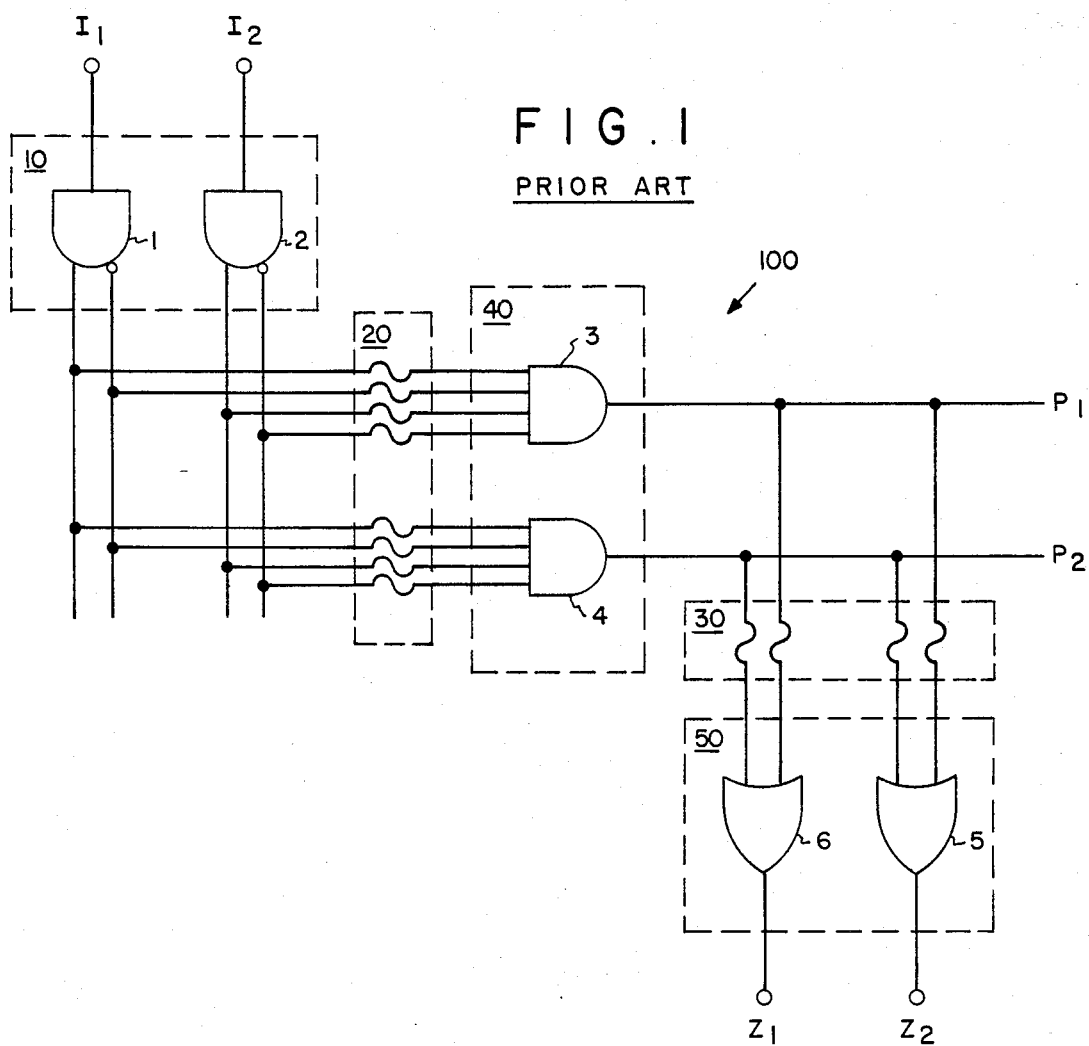
FIG. 1 shows a block diagram of a programmable logic array of the prior art.

Referring to FIG. 1, there is shown a programmable logic array (PLA) 100 of the prior art containing an input block 10 providing input terminals for receiving input signals $I_1$, $I_2$, operatively connected to a first fusible links network 20 of a product (AND) array 40, which in turn outputs product terms $P_1$ and $P_2$. The product terms are operatively connected through a second fusible links network 30 of a sum (OR) array 50 providing outputs $Z_1$, $Z_2$. The input block 10 comprises input buffers 1, 2 each having an output and an inverted (or complement) output, the inverted output having the circle denoting the inversion function. The product array 40 comprises two, four-input AND gates 3, 4, each input of each AND gate 3, 4 having a fusible link connected to each input of the AND gates 3, 4, the fusible links forming the first fusible link network 20. Each input of each AND gate 3, 4 is operatively connected to a respective output of input block 10. The sum array 50 comprises two OR gates 5, 6, each OR gate 5, 6 having two inputs each of which is operatively connected to a respective product $P_1$, $P_2$. Each input of each OR gate has associated therewith a fusible link, these fusible links comprising a second fusible links network 30. The PLA 100 can be programmed by vaporizing (i.e., the fusible link is electrically opened thereby breaking or opening the circuit) each link as desired to generate the desired logic output terms $Z_1$ and $Z_2$.

Prior to programming PLA 100 it is desirable to test the PLA 100 in the unprogrammed state. (Programming a PLA 100 may also be denoted herein by terms customizing or personalizing a PLA.) Since the inputs to AND gate 3 will include the terms $I_1$ and $\overline{I_1}$, and since $I_1 \cdot \overline{I_1} = 0$, AND gate 3 can never be fully tested.

Referring to FIG. 2, there is shown a functional logic drawing of a PLA 101 which includes test logic for providing static (or dc) test capability which tests the PLA 101 in the unprogrammed state, the test logic for providing the static test capability of the PLA also being described in the related application of paragraph (a) referred to above. The PLA 101 includes input buffers 1, 2 operatively connected to two four-input AND gates 3, 4 through fusible links 21-28, the inputs to each AND gate denoted 1-4, and each AND gate outputs respective product terms $P_1$, $P_2$ (also denoted as A, B.) Each product term is operatively connected to two-input OR gates 5, 6 through respective fusible links 31-34, the inputs to each OR gate denoted 1, 2, and each OR gate outputs respective output terms $Z_1$, $Z_2$.

Static testing of PLA 101 in the unprogrammed state is performed by setting predetermined select 1 control signals TT and TC and predetermined select 2 control signals $T_1$ and $T_2$, varying the input signals, $I_1$ and $I_2$, to input buffer 1, 2 to various combinations of logic 1 and logic 0, and verifying output signals $Z_1$ and $Z_2$ for each combination of input signal $I_1$ and $I_2$. By setting select 1 control signal TT to a logic zero and TC to a logic one, pull down logic 7 operates to force input gate 1,2 complement outputs 12' and 14' to a logic one. By setting control signals $T_1$ and $T_2$ to a logic 1 and logic 0 respectively, selector 8 causes line B' to have a predetermined logic state, i.e., a logic 0, while line A' operates normally, i.e., the signal on line A' follows the signal on line A, which is the product signal $P_1$.

The testing procedure will now be described in conjunction with FIG. 2 and Table 1. Step 1 of the test procedure sets input signals $I_1$ and $I_2$ to a logic 1. The outputs of input buffer 1 are respectively a logic 1 and logic 0 on lines 11 and 12, respectively. The output signal of input buffer 2 is a logic 1 and logic 0 on lines 13 and 14, respectively. Because the pulldown logic 7 forces the complement output 12' and 14' to a logic 1 all four outputs 11' through 14' of pulldown logic 7 are all at logic 1. Since all four inputs to the AND gates 3, 4 are logic ones, the outputs of AND gates 3, 4 (A, B) are both at logic one. The A' output of selector 8 will be a logic 1, since control signal $T_1$ has been set to a logic 1 thereby allowing the signal on line A' to follow the signal on line A. Since control signal $T_2$ has been set to a logic zero, the B' output of selector 8 is forced to a logic zero. Hence, the one input of OR gates 5, 6 will have a logic 1 and the two input of OR gates 5, 6 will have a logic 0. Since one input of the OR gate is conditioned (the one input of both OR gates 5, 6 have a logic one), the $Z_1$ and $Z_2$ outputs will both be a logic 1. The logic levels thus described are in accordance with step 1 of Table 1.

TABLE 1

| Step | $I_1$ | $I_2$ | TT | TC | A | B | $T_1$ | $T_2$ | A' | B' | $Z_1$ | $Z_2$ |
|---|---|---|---|---|---|---|---|---|---|---|---|---|
| 1 | 1 | 1 | 0 | 1 | 1 | 1 | 1 | 0 | 1 | 0 | 1 | 1 |
| 2 | 0 | 1 | 0 | 1 | 0 | 0 | 1 | 0 | 0 | 0 | 0 | 0 |
| 3 | 1 | 0 | 0 | 1 | 0 | 0 | 1 | 0 | 0 | 0 | 0 | 0 |
| 4 | 0 | 0 | 1 | 0 | 1 | 1 | 1 | 0 | 1 | 0 | 1 | 1 |
| 5 | 1 | 0 | 1 | 0 | 0 | 0 | 1 | 0 | 0 | 0 | 0 | 0 |
| 6 | 0 | 1 | 1 | 0 | 0 | 0 | 1 | 0 | 0 | 0 | 0 | 0 |
| 7 | 1 | 1 | 0 | 1 | 1 | 1 | 0 | 1 | 0 | 1 | 1 | 1 |
| 8 | 0 | 1 | 0 | 1 | 0 | 0 | 0 | 1 | 0 | 0 | 0 | 0 |
| 9 | 1 | 0 | 0 | 1 | 0 | 0 | 0 | 1 | 0 | 0 | 0 | 0 |
| 10 | 0 | 0 | 1 | 0 | 1 | 1 | 0 | 1 | 0 | 1 | 1 | 1 |
| 11 | 1 | 0 | 1 | 0 | 0 | 0 | 0 | 1 | 0 | 0 | 0 | 0 |
| 12 | 0 | 1 | 1 | 0 | 0 | 0 | 0 | 1 | 0 | 0 | 0 | 0 |

Steps 2 and 3 vary the input signals $I_1$ and $I_2$ verifying the one input of OR gates 5, 6, and verifying the 1 and 4 input of AND gate 3, respectively. Step 1 and Step 4 also check the true output and complement output of input buffer 1, 2 respectively. Steps 4, 5 and 6 reverse the select 1 control signals thereby forcing the true output of input buffer 1, 2 to a logic 1, namely 11' and 13' are forced to a logic 1. This permits steps 5 and 6 to verify the proper functioning of the 2 and 3 input of AND gate 3. Steps 7-12 essentially repeat steps 1-6 above but the select 2 control signals, $T_1$ and $T_2$, are reversed. In this case, selector 8 forces line A' to a logic 0 and allows the signal on line B' to follow the input signal B, thereby verifying the functioning of the 2 input of OR gates 5,6. In addition, steps 8, 9, 11, 12 verify the proper functioning of inputs 1, 4, 2, and 3 of AND gate 4, respectively.

The circuit of the input buffer 1, 2 is shown in FIG. 3. The PLA 101 shown in FIG. 3 is implemented in current mode logic (CML) technology. Negative logic is utilized in PLA 101. In the preferred embodiment, a logic 0 is 0 volts and a logic 1 is −0.5 volts or −500 millivolts (−0.5 V or −500 MV). Typical component values are as follows:

resistors 201, 202, 203—50 ohms resistor 204—10,000 ohms
resistors 205, 206—560 ohms
resistor 207—270 ohms
resistor 208—50 ohms
resistor 209—10,000 ohms
resistor 210—50 ohms
resistors 211, 212—2,000 ohms
$V_e$—3.3 volts
$V_1$—0.26 volts
$V_3$—2.25 volts Also shown in FIG. 3 is the circuit diagram of pulldown logic 7. The true output lines 11, 13 of input buffer 1, 2 are tied through diodes 71, 73 to the TT select 1 control line. Similarly, the complement output 12, 14 of input gates 1, 2 are each tied through diodes 72, 74, to TC control line of select 1 control signal. The control signals TT, TC operate to pull down the respective line to a logic 1. The TT, TC control signal operate such that the line varies between 0 volts and $-1$ volts, 0 volts corresponding to a logic zero and a $-1$ volt corresponding to a logic 1.

Figure 4:
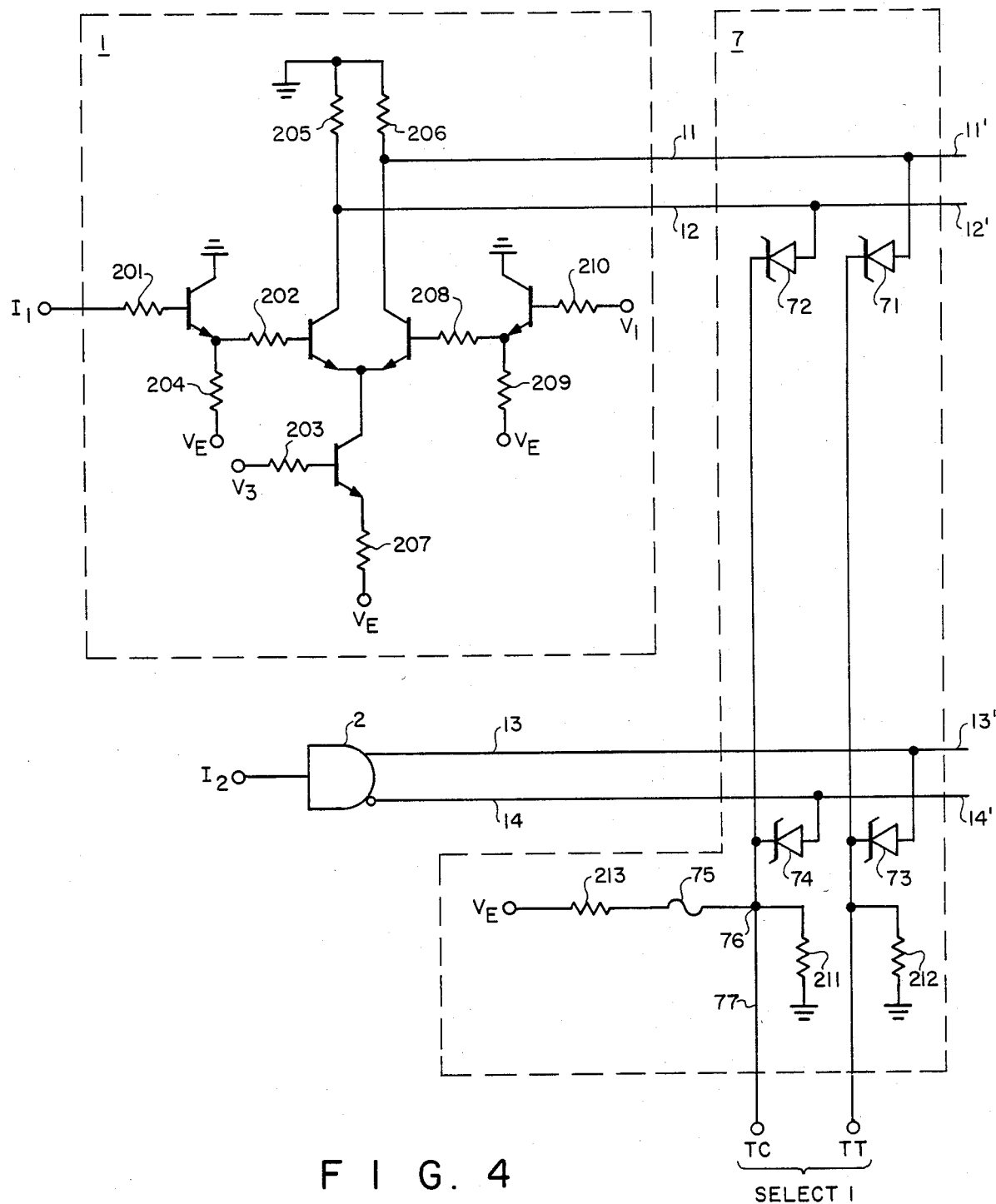
FIG. 4 shows a circuit diagram of the pulldown logic modified to provide dynamic test capability.

In order to provide dynamic (or ac) test capability of the PLA 101, pulldown logic 7 is modified by including additional circuit components. Referring to FIG. 4, there is shown a circuit diagram of the preferred embodiment of the present invention whereby the test logic, i.e., pulldown logic 7, is modified by the inclusion of the additional circuit components. A resistor 213 is connected to node 76 of TC line 77 through a fusible link 75. The resistor is also connected to the voltage source $V_e$. It is to be appreciated by those skilled in the art that the fusible links referenced herein may be any type of link which may be broken electrically or otherwise. For example, the fusible links can include metallized links which also form a normal transmission or connection path which may be vaporized by laser techniques.

As mentioned above, $V_e$ is nominally $-3.3$ volts, and resistor 213 is selected such that when terminals TC and TT are floating, node 76 is at a logic 1. A typical value for resistor 213 in the preferred embodiment is 93 ohms, and node 76 will typically have a value of $-1.0$ to $-1.5$ volts. When select 1 control signal TC is set to 0 volts, diode 72, 74 may or may not conduct depending on the value of the signal on line 12, 14. The value of the signal on line 12, 14 is $-0.5$ volts, the respective diodes 72, 74 are back biased and the input lines 12', 14', are $-0.5$ volts or a logic one. If the value of the signal on line 12, 14 is 0 volts, diodes 72, 74 are inoperative and the input lines 12', 14' are 0 volts or a logic 0. When the select 1 control signal TC is set to $-1$ volts, the diodes 72, 74 will conduct independent of the signal level of line 12, 14 such that line 12', 14' will be pulled down to a logic one. Hence, the test logic of pulldown logic 7 is operative for static testing as described above even with the inclusion of the added circuit components.

During static testing, which is generally performed on each integrated circuit chip of a wafer, the terminals (or pads) TC and TT are accessible for connection to a test source which provides the select 1 control signals TT and TC. However, after the wafer is scribed and the integrated circuits are each individually mounted, the terminals TC and TT are not accessible since an additional layer has been added, known as a pasivation layer. As a result, terminals TC and TT are floating, and node 76 will be at $-1.0$ to $-1.5$ volts. As a result, line 12', 14' will be about $-0.5$ to $-1.0$ volts, or a logic one, after accounting for approximately a 0.5 volt drop across diode 72, 74.

Referring back to FIG. 2, inputs 2, 4 to AND gates 3, 4 will be at a logic one. Inputs 1, 3 to AND gates 3, 4 are a function of inputs $I_1$ and $I_2$. By setting $I_2$ to a logic one, and providing a pulse input to input $I_1$ a resulting pulse output at $Z_1$ results, and the time delay can be measured. Similarly, $I_1$ can be set to a logic 1 and a pulse input provided at input $I_2$, and the output pulse at $Z_2$ can be observed and the resulting time delay measured. It is obvious to one skilled in the art that the measurements can be manual, i.e., a dual-trace scope connected to the input terminals $I_1$, $I_2$ and connected to the output terminals $Z_1$, $Z_2$, and the delay observed by a test operator, or can be by automated equipment designed to measure time delay known to those skilled in the art. Since all the inputs to all the AND gates and OR gates are included, i.e., the PLA is in the unprogrammed state, the measured time delay is a worst-case time delay.

After the dynamic testing has been performed, the fusible links 21–28, and the fusible links 31–34, can be broken as desired to yield the desired programmed programmable logic device. In addition, during the programming process, one additional link must be broken, namely, fusible link 75. Breaking fusible link 75 allows input line 12' 14' to correspond to the respective input signal at $I_1$, $I_2$.

Figure 5:
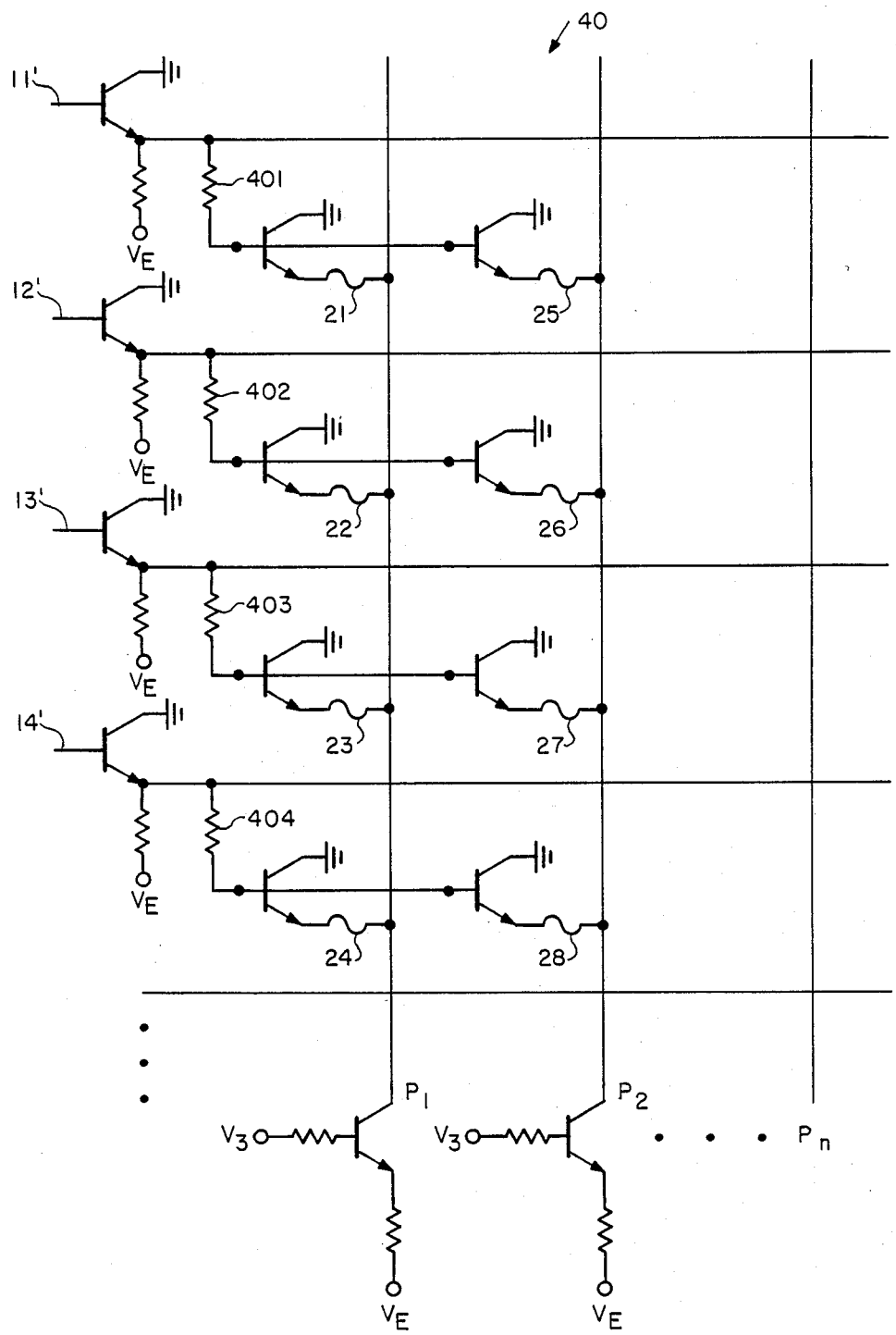
FIG. 5 shows a circuit diagram of a product array of the programmable logic array.

The circuit diagram of the product array 40 is shown in FIG. 5. Resistors 401-404 are typically 100 ohms. The fusible links 21–28 are shown and correspond to the fusible links of FIG. 2. Still referring to FIG. 5, the product terms $P_1$ and $P_2$ are shown as the output of their respective AND gates 3, 4. Although only two input buffers have been shown and discussed thus far, it will be understood by those skilled in the art that more input buffers may be implemented. Two 4-input AND gates have been discussed thus far. It will be appreciated and understood by those skilled in the art that more AND gates may be implemented resulting in an increased number of product terms. The circuit diagram shown in FIG. 5 can be expanded to increase the number of product terms up to $P_n$ by adding a like number of circuits in each vertical column. For additional input buffers additional input lines can be added to increase the number of inputs to each respective AND gate.

The sum array 50 is implemented utilizing Boolean equivalent:

$$A + B = \overline{\overline{A} \cdot \overline{B}}$$

Figure 6:
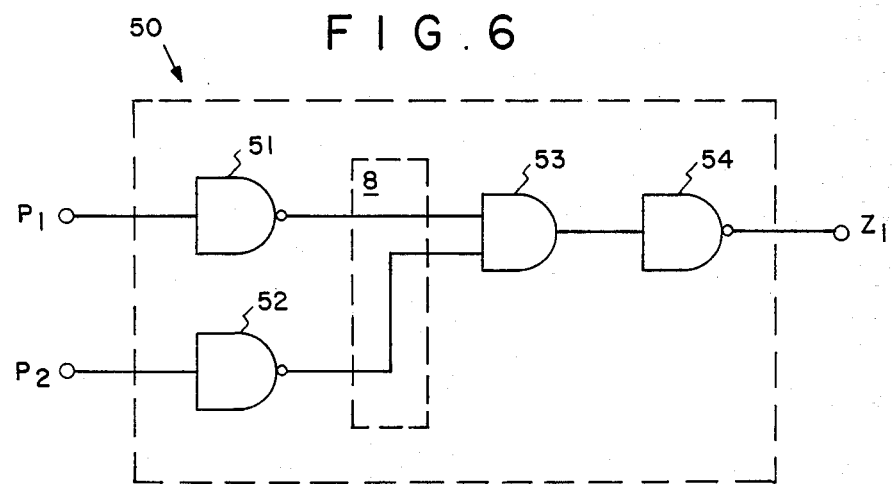
FIG. 6 shows a logic equivalent of the sum gates.

Hence, the OR gates 5, 6 are each implemented logically as shown in FIG. 6. Although the selector 8 is functionally placed at the input of the OR gates 5, 6 as shown in FIG. 2, the selector logic 8 is more readily positioned and more easily implemented in CML (current mode logic) as shown in FIG. 6 and will be described in further detail hereinunder.

Figure 7:
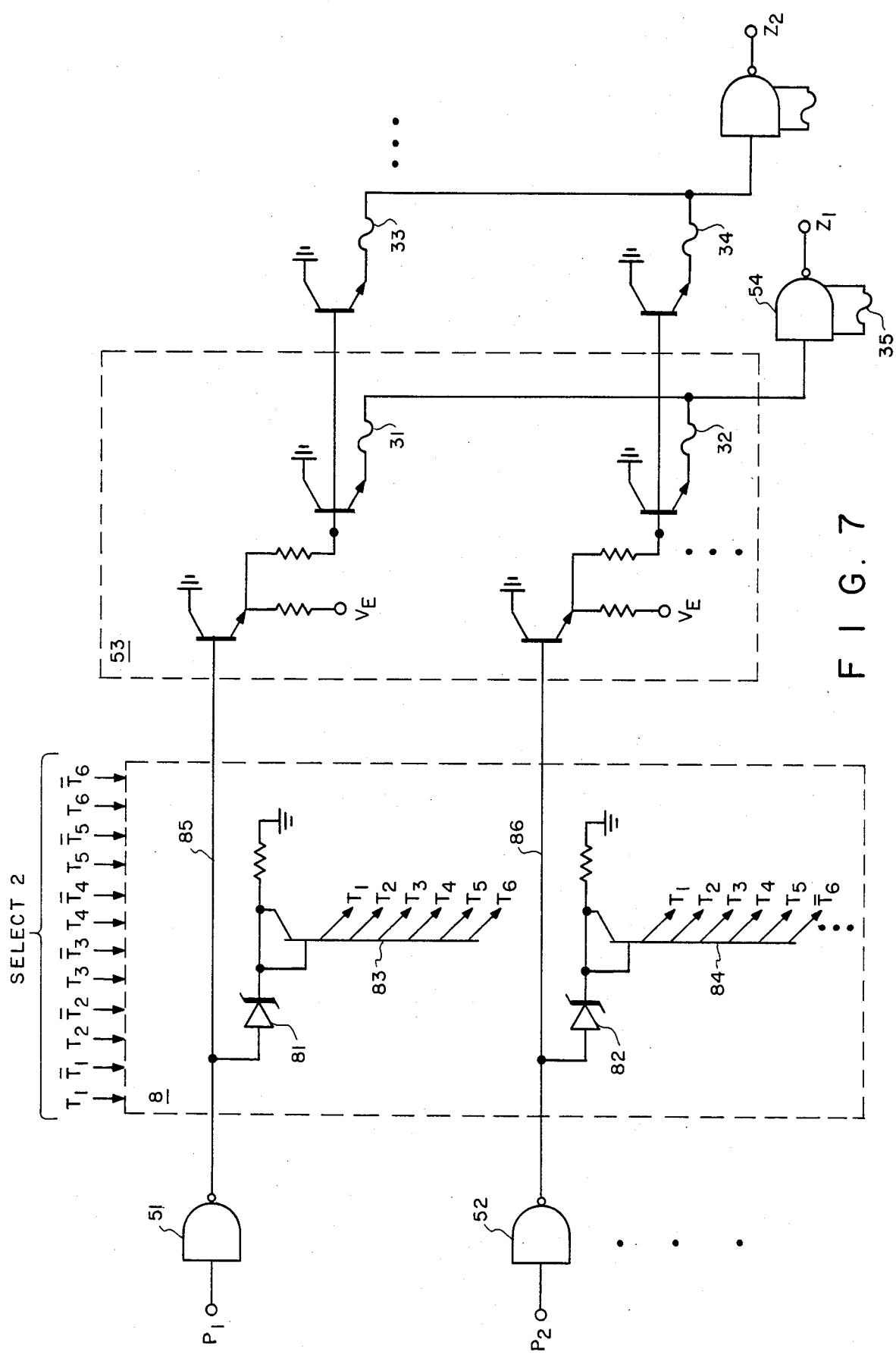
FIG. 7 shows the circuit diagram of a sum array and a selector network.

FIG. 7 shows the circuit diagram of the sum array 50 and the selector 8 which corresponds to FIG. 6. Inverters 51 and 52 receive the product inputs $P_1$ and $P_2$, respectively. Each inverter 51, 52 may be implemented utilizing the circuit diagram of the input buffer 1 utilizing only the complement output. The output of each inverter 51, 52 is operatively coupled to the AND array 53 through selector 8.

Selector 8 comprises a diode 81, 82 coupled to the output of its respective inverter 51, 52. Each diode 81, 82 has coupled thereto a 6-emitter transistor 83, 84 the six emitters of each transistor being selectively coupled to six of the twelve select 2 control signals. The twelve individual select 2 control signals are denoted $T_1$ through $T_6$ and $\overline{T_1}$ through $\overline{T_6}$. Twelve signals are required to select the forty product terms in the preferred embodiment. If any of the select 2 control signals is set to a −2 volts, the input line 85, 86 will be pulled down to a −0.7 volts or a logic 1, which is the functional equivalent of pulling down A' or B' to a logic 0. In the testing process all transistors but one will be pulled down. The emitter connections for transistor 83 are connected to select 2 control signals T1, T2, T3, T4, T5, and T6 and transistor 84 is connected to select 2 control signal $T_1$, $T_2$, $T_3$, $T_4$, $T_5$, and $\overline{T_6}$. Thus when select control signal T1-T6 are respectively at logic 000000 (and $T1$-$\overline{T6}$ are therefore at logic 111111), all the emitter connections of transistor 83 will be at a logic 0 (0 volts) thereby enabling line 85. All the other lines, 86, will have at least one emitter connected to a logic 1, or −2 volts thereby holding line 86 to a logic 1 (for example, emitter $T_6$ of transistor 84 connected to $\overline{T_6}$ which is a logic 1 or −2 volts). When $T_1$-$T_6$ are at logic 000001, transistor 84 will be selected. Thus, only one product turn will be enabled by selector logic 8 as discussed above.

The circuit diagram of AND gate 53 shown in FIG. 7 has a similar configuration to the product array 40 as discussed above. Fusible links 31 and 32 correspond to the fusible links of OR gate 5 of FIG. 2. Likewise, fusible links 33 and 34 correspond to the fusible links of OR gate 6 of FIG. 2. Still referring to FIG. 7, inverter 54 forms part of the sum array 50 as discussed above in connection with Boolean equivalent. Inverter 54 may be an exclusive OR, containing a fusible link 35 to yield the inverted output $Z_1$. Although only two OR gates have been discussed it will be understood by those skilled in the art that a greater number of OR gates 5, 6 may be added.

Twelve OR gates are implemented in the preferred embodiment of the sum array 50 resulting in a programmable logic array PLA 101 containing 22 inputs, 12 outputs and 40 P-terms, i.e., 22 input buffers, 40 AND gates, and 12 OR gates. The static testing of PLA 101 requires 1,840 steps. The test sequence is shown in Table 2 and 2A. Test No. 1–46 is conducted in accordance with numbers 1–46, test number 47–92 consists of repeating the test sequence of numbers 1–46 of Table 2 varying the select 2 control inputs as indicated in Table 2A. Test Nos. 93–138, etc. are repeated until 1,840 steps have been completed. This sequence checks the inputs of all the gates of the PLA 101. It will be appreciated by those skilled in the art that the steps may be done manually or may be implemented using automated means, such as computer driven test signals.

The dynamic testing of PLA 101 requires the 44 steps of Table 2B.

While there has been shown what is considered to be the preferred embodiment of the invention, it will be manifest that many changes and modifications can be made therein without departing from the essential spirit and scope of the invention. It is intended, therefore, in the annexed claims, to cover all such changes and modifications which fall within the true scope of the invention.

TABLE 2

| | | | | | "0" = 0.0 V | | | | | | | | | | | | | | | | | | | | | | | | | | | | | | | |
|---|---|---|---|---|---|---|---|---|---|---|---|---|---|---|---|---|---|---|---|---|---|---|---|---|---|---|---|---|---|---|---|---|---|---|---|---|
| | "0" = 0.0 V | | | | "1" = −0.5 V | | | | | | | | | | | | | | | | | | | | | | | | | | | | | | | |
| | "1" = −1.2 V | | | | | | | | | | | | | | | | | | | | | | | | | | | | | | | | | | | |
| NUM | T T | T C | I 0 1 | I 0 2 | I 0 3 | I 0 4 | I 0 5 | I 0 6 | I 0 7 | I 0 8 | I 0 9 | I 1 0 | I 1 1 | I 1 2 | I 1 3 | I 1 4 | I 1 5 | I 1 6 | I 1 7 | I 1 8 | I 1 9 | I 2 0 | I 2 1 | I 2 2 | N 0 1 | N 0 2 | N 0 3 | N 0 4 | N 0 5 | N 0 6 | N 0 7 | N 0 8 | N 0 9 | N 1 0 | N 1 1 | N 1 2 |
| 1 | 0 | 1 | 1 | 0 | 1 | 1 | 1 | 1 | 1 | 1 | 1 | 1 | 1 | 1 | 1 | 1 | 1 | 1 | 1 | 1 | 1 | 1 | 1 | 1 | 1 | 0 | 0 | 0 | 0 | 0 | 0 | 0 | 0 | 0 | 0 | 0 |
| 2 | 0 | 1 | 0 | 1 | 0 | 1 | 1 | 1 | 1 | 1 | 1 | 1 | 1 | 1 | 1 | 1 | 1 | 1 | 1 | 1 | 1 | 1 | 1 | 1 | 0 | 0 | 0 | 0 | 0 | 0 | 0 | 0 | 0 | 0 | 0 | 0 |
| 3 | 0 | 1 | 1 | 0 | 1 | 0 | 1 | 1 | 1 | 1 | 1 | 1 | 1 | 1 | 1 | 1 | 1 | 1 | 1 | 1 | 1 | 1 | 1 | 1 | 0 | 0 | 0 | 0 | 0 | 0 | 0 | 0 | 0 | 0 | 0 | 0 |
| 4 | 0 | 1 | 1 | 1 | 0 | 1 | 0 | 1 | 1 | 1 | 1 | 1 | 1 | 1 | 1 | 1 | 1 | 1 | 1 | 1 | 1 | 1 | 1 | 1 | 0 | 0 | 0 | 0 | 0 | 0 | 0 | 0 | 0 | 0 | 0 | 0 |
| 5 | 0 | 1 | 1 | 1 | 1 | 0 | 1 | 0 | 1 | 1 | 1 | 1 | 1 | 1 | 1 | 1 | 1 | 1 | 1 | 1 | 1 | 1 | 1 | 1 | 0 | 0 | 0 | 0 | 0 | 0 | 0 | 0 | 0 | 0 | 0 | 0 |
| 6 | 0 | 1 | 1 | 1 | 1 | 1 | 0 | 1 | 0 | 1 | 1 | 1 | 1 | 1 | 1 | 1 | 1 | 1 | 1 | 1 | 1 | 1 | 1 | 1 | 0 | 0 | 0 | 0 | 0 | 0 | 0 | 0 | 0 | 0 | 0 | 0 |
| 7 | 0 | 1 | 1 | 1 | 1 | 1 | 1 | 0 | 1 | 0 | 1 | 1 | 1 | 1 | 1 | 1 | 1 | 1 | 1 | 1 | 1 | 1 | 1 | 1 | 0 | 0 | 0 | 0 | 0 | 0 | 0 | 0 | 0 | 0 | 0 | 0 |
| 8 | 0 | 1 | 1 | 1 | 1 | 1 | 1 | 1 | 0 | 1 | 0 | 1 | 1 | 1 | 1 | 1 | 1 | 1 | 1 | 1 | 1 | 1 | 1 | 1 | 0 | 0 | 0 | 0 | 0 | 0 | 0 | 0 | 0 | 0 | 0 | 0 |
| 9 | 0 | 1 | 1 | 1 | 1 | 1 | 1 | 1 | 1 | 0 | 1 | 0 | 1 | 1 | 1 | 1 | 1 | 1 | 1 | 1 | 1 | 1 | 1 | 1 | 0 | 0 | 0 | 0 | 0 | 0 | 0 | 0 | 0 | 0 | 0 | 0 |
| 10 | 0 | 1 | 1 | 1 | 1 | 1 | 1 | 1 | 1 | 1 | 0 | 1 | 0 | 1 | 1 | 1 | 1 | 1 | 1 | 1 | 1 | 1 | 1 | 1 | 0 | 0 | 0 | 0 | 0 | 0 | 0 | 0 | 0 | 0 | 0 | 0 |
| 11 | 0 | 1 | 1 | 1 | 1 | 1 | 1 | 1 | 1 | 1 | 1 | 0 | 1 | 0 | 1 | 1 | 1 | 1 | 1 | 1 | 1 | 1 | 1 | 1 | 0 | 0 | 0 | 0 | 0 | 0 | 0 | 0 | 0 | 0 | 0 | 0 |
| 12 | 0 | 1 | 1 | 1 | 1 | 1 | 1 | 1 | 1 | 1 | 1 | 1 | 0 | 1 | 0 | 1 | 1 | 1 | 1 | 1 | 1 | 1 | 1 | 1 | 0 | 0 | 0 | 0 | 0 | 0 | 0 | 0 | 0 | 0 | 0 | 0 |
| 13 | 0 | 1 | 1 | 1 | 1 | 1 | 1 | 1 | 1 | 1 | 1 | 1 | 1 | 0 | 1 | 0 | 1 | 1 | 1 | 1 | 1 | 1 | 1 | 1 | 0 | 0 | 0 | 0 | 0 | 0 | 0 | 0 | 0 | 0 | 0 | 0 |
| 14 | 0 | 1 | 1 | 1 | 1 | 1 | 1 | 1 | 1 | 1 | 1 | 1 | 1 | 1 | 0 | 1 | 0 | 1 | 1 | 1 | 1 | 1 | 1 | 1 | 0 | 0 | 0 | 0 | 0 | 0 | 0 | 0 | 0 | 0 | 0 | 0 |
| 15 | 0 | 1 | 1 | 1 | 1 | 1 | 1 | 1 | 1 | 1 | 1 | 1 | 1 | 1 | 1 | 0 | 1 | 0 | 1 | 1 | 1 | 1 | 1 | 1 | 0 | 0 | 0 | 0 | 0 | 0 | 0 | 0 | 0 | 0 | 0 | 0 |
| 16 | 0 | 1 | 1 | 1 | 1 | 1 | 1 | 1 | 1 | 1 | 1 | 1 | 1 | 1 | 1 | 1 | 0 | 1 | 0 | 1 | 1 | 1 | 1 | 1 | 0 | 0 | 0 | 0 | 0 | 0 | 0 | 0 | 0 | 0 | 0 | 0 |
| 17 | 0 | 1 | 1 | 1 | 1 | 1 | 1 | 1 | 1 | 1 | 1 | 1 | 1 | 1 | 1 | 1 | 1 | 0 | 1 | 0 | 1 | 1 | 1 | 1 | 0 | 0 | 0 | 0 | 0 | 0 | 0 | 0 | 0 | 0 | 0 | 0 |
| 18 | 0 | 1 | 1 | 1 | 1 | 1 | 1 | 1 | 1 | 1 | 1 | 1 | 1 | 1 | 1 | 1 | 1 | 1 | 0 | 1 | 0 | 1 | 1 | 1 | 0 | 0 | 0 | 0 | 0 | 0 | 0 | 0 | 0 | 0 | 0 | 0 |
| 19 | 0 | 1 | 1 | 1 | 1 | 1 | 1 | 1 | 1 | 1 | 1 | 1 | 1 | 1 | 1 | 1 | 1 | 1 | 1 | 0 | 1 | 0 | 1 | 1 | 0 | 0 | 0 | 0 | 0 | 0 | 0 | 0 | 0 | 0 | 0 | 0 |
| 20 | 0 | 1 | 1 | 1 | 1 | 1 | 1 | 1 | 1 | 1 | 1 | 1 | 1 | 1 | 1 | 1 | 1 | 1 | 1 | 1 | 0 | 1 | 0 | 1 | 0 | 0 | 0 | 0 | 0 | 0 | 0 | 0 | 0 | 0 | 0 | 0 |
| 21 | 0 | 1 | 1 | 1 | 1 | 1 | 1 | 1 | 1 | 1 | 1 | 1 | 1 | 1 | 1 | 1 | 1 | 1 | 1 | 1 | 1 | 0 | 1 | 0 | 0 | 0 | 0 | 0 | 0 | 0 | 0 | 0 | 0 | 0 | 0 | 0 |
| 22 | 0 | 1 | 1 | 1 | 1 | 1 | 1 | 1 | 1 | 1 | 1 | 1 | 1 | 1 | 1 | 1 | 1 | 1 | 1 | 1 | 1 | 1 | 0 | 1 | 0 | 0 | 0 | 0 | 0 | 0 | 0 | 0 | 0 | 0 | 0 | 0 |
| 23 | 0 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 0 | 0 | 0 | 0 | 0 | 0 | 0 | 0 | 0 | 0 | 0 | 0 | 1 |
| 24 | 1 | 0 | 0 | 1 | 1 | 1 | 1 | 1 | 1 | 1 | 1 | 1 | 1 | 1 | 1 | 1 | 1 | 1 | 1 | 1 | 1 | 1 | 1 | 1 | 0 | 0 | 0 | 0 | 0 | 0 | 0 | 0 | 0 | 0 | 0 | 0 |
| 25 | 1 | 0 | 0 | 0 | 1 | 1 | 1 | 1 | 1 | 1 | 1 | 1 | 1 | 1 | 1 | 1 | 1 | 1 | 1 | 1 | 1 | 1 | 1 | 1 | 1 | 0 | 0 | 0 | 0 | 0 | 0 | 0 | 0 | 0 | 0 | 0 |
| 26 | 1 | 0 | 0 | 0 | 0 | 1 | 1 | 1 | 1 | 1 | 1 | 1 | 1 | 1 | 1 | 1 | 1 | 1 | 1 | 1 | 1 | 1 | 1 | 1 | 0 | 1 | 0 | 0 | 0 | 0 | 0 | 0 | 0 | 0 | 0 | 0 |
| 27 | 1 | 0 | 0 | 0 | 0 | 0 | 1 | 1 | 1 | 1 | 1 | 1 | 1 | 1 | 1 | 1 | 1 | 1 | 1 | 1 | 1 | 1 | 1 | 1 | 0 | 0 | 1 | 0 | 0 | 0 | 0 | 0 | 0 | 0 | 0 | 0 |
| 28 | 1 | 0 | 0 | 0 | 0 | 0 | 0 | 1 | 1 | 1 | 1 | 1 | 1 | 1 | 1 | 1 | 1 | 1 | 1 | 1 | 1 | 1 | 1 | 1 | 0 | 0 | 0 | 1 | 0 | 0 | 0 | 0 | 0 | 0 | 0 | 0 |
| 29 | 1 | 0 | 0 | 0 | 0 | 0 | 0 | 0 | 1 | 1 | 1 | 1 | 1 | 1 | 1 | 1 | 1 | 1 | 1 | 1 | 1 | 1 | 1 | 1 | 0 | 0 | 0 | 0 | 1 | 0 | 0 | 0 | 0 | 0 | 0 | 0 |
| 30 | 1 | 0 | 0 | 0 | 0 | 0 | 0 | 0 | 0 | 1 | 1 | 1 | 1 | 1 | 1 | 1 | 1 | 1 | 1 | 1 | 1 | 1 | 1 | 1 | 0 | 0 | 0 | 0 | 0 | 1 | 0 | 0 | 0 | 0 | 0 | 0 |
| 31 | 1 | 0 | 0 | 0 | 0 | 0 | 0 | 0 | 0 | 0 | 1 | 1 | 1 | 1 | 1 | 1 | 1 | 1 | 1 | 1 | 1 | 1 | 1 | 1 | 0 | 0 | 0 | 0 | 0 | 0 | 1 | 0 | 0 | 0 | 0 | 0 |
| 32 | 1 | 0 | 0 | 0 | 0 | 0 | 0 | 0 | 0 | 0 | 0 | 1 | 1 | 1 | 1 | 1 | 1 | 1 | 1 | 1 | 1 | 1 | 1 | 1 | 0 | 0 | 0 | 0 | 0 | 0 | 0 | 1 | 0 | 0 | 0 | 0 |
| 33 | 1 | 0 | 0 | 0 | 0 | 0 | 0 | 0 | 0 | 0 | 0 | 0 | 1 | 1 | 1 | 1 | 1 | 1 | 1 | 1 | 1 | 1 | 1 | 1 | 0 | 0 | 0 | 0 | 0 | 0 | 0 | 0 | 1 | 0 | 0 | 0 |
| 34 | 1 | 0 | 0 | 0 | 0 | 0 | 0 | 0 | 0 | 0 | 0 | 0 | 0 | 1 | 1 | 1 | 1 | 1 | 1 | 1 | 1 | 1 | 1 | 1 | 0 | 0 | 0 | 0 | 0 | 0 | 0 | 0 | 0 | 1 | 0 | 0 |
| 35 | 1 | 0 | 0 | 0 | 0 | 0 | 0 | 0 | 0 | 0 | 0 | 0 | 0 | 0 | 1 | 1 | 1 | 1 | 1 | 1 | 1 | 1 | 1 | 1 | 0 | 0 | 0 | 0 | 0 | 0 | 0 | 0 | 0 | 0 | 1 | 0 |
| 36 | 1 | 0 | 0 | 0 | 0 | 0 | 0 | 0 | 0 | 0 | 0 | 0 | 0 | 0 | 0 | 1 | 1 | 1 | 1 | 1 | 1 | 1 | 1 | 1 | 0 | 0 | 0 | 0 | 0 | 0 | 0 | 0 | 0 | 0 | 0 | 1 |
| 37 | 1 | 0 | 0 | 0 | 0 | 0 | 0 | 0 | 0 | 0 | 0 | 0 | 0 | 0 | 0 | 0 | 1 | 1 | 1 | 1 | 1 | 1 | 1 | 1 | 0 | 0 | 0 | 0 | 0 | 0 | 0 | 0 | 0 | 0 | 0 | 0 |
| 38 | 1 | 0 | 0 | 0 | 0 | 0 | 0 | 0 | 0 | 0 | 0 | 0 | 0 | 0 | 0 | 0 | 0 | 1 | 1 | 1 | 1 | 1 | 1 | 1 | 0 | 0 | 0 | 0 | 0 | 0 | 0 | 0 | 0 | 0 | 0 | 0 |
| 39 | 1 | 0 | 0 | 0 | 0 | 0 | 0 | 0 | 0 | 0 | 0 | 0 | 0 | 0 | 0 | 0 | 0 | 0 | 1 | 1 | 1 | 1 | 1 | 1 | 0 | 0 | 0 | 0 | 0 | 0 | 0 | 0 | 0 | 0 | 0 | 0 |
| 40 | 1 | 0 | 0 | 0 | 0 | 0 | 0 | 0 | 0 | 0 | 0 | 0 | 0 | 0 | 0 | 0 | 0 | 0 | 0 | 1 | 1 | 1 | 1 | 1 | 0 | 0 | 0 | 0 | 0 | 0 | 0 | 0 | 0 | 0 | 0 | 0 |
| 41 | 1 | 0 | 0 | 0 | 0 | 0 | 0 | 0 | 0 | 0 | 0 | 0 | 0 | 0 | 0 | 0 | 0 | 0 | 0 | 0 | 1 | 1 | 1 | 1 | 0 | 0 | 0 | 0 | 0 | 0 | 0 | 0 | 0 | 0 | 0 | 0 |
| 42 | 1 | 0 | 0 | 0 | 0 | 0 | 0 | 0 | 0 | 0 | 0 | 0 | 0 | 0 | 0 | 0 | 0 | 0 | 0 | 0 | 0 | 1 | 1 | 1 | 0 | 0 | 0 | 0 | 0 | 0 | 0 | 0 | 0 | 0 | 0 | 0 |
| 43 | 1 | 0 | 0 | 0 | 0 | 0 | 0 | 0 | 0 | 0 | 0 | 0 | 0 | 0 | 0 | 0 | 0 | 0 | 0 | 0 | 0 | 0 | 1 | 1 | 0 | 0 | 0 | 0 | 0 | 0 | 0 | 0 | 0 | 0 | 0 | 0 |
| 44 | 1 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 1 | 0 | 0 | 0 | 0 | 0 | 0 | 0 | 0 | 0 | 0 | 0 | 0 |
| 45 | 1 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
| 46 | 1 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |

TABLE 2A

| Test Number | "0" = 0.0 V "1" = −2.0 V | | | | | | | | | | | | "0" = 0.0 V "1" = −1.2 V | | "0" = 0.0 V "1" = −0.5 V | |
|---|---|---|---|---|---|---|---|---|---|---|---|---|---|---|---|---|
| | T1 | T2 | T3 | T4 | T5 | T6 | T1 | T2 | T3 | T4 | T5 | T6 | T T | T .C | INPUTS | OUTPUTS |
| 1–46 | 0 | 0 | 0 | 0 | 0 | 0 | 1 | 1 | 1 | 1 | 1 | 1 | TEST | TEST | TEST | TEST |
| 47–92 | 0 | 0 | 0 | 0 | 0 | 1 | 1 | 1 | 1 | 1 | 1 | 0 | ALL | ALL | ALL | ALL |
| 93–138 | 0 | 0 | 0 | 0 | 1 | 0 | 1 | 1 | 1 | 1 | 0 | 1 | CASES | CASES | CASES | CASES |
| 139–184 | 0 | 0 | 0 | 0 | 1 | 1 | 1 | 1 | 1 | 1 | 0 | 0 | | | | |
| 185–230 | 0 | 0 | 0 | 1 | 0 | 0 | 1 | 1 | 1 | 0 | 1 | 1 | | | | |
| 231–276 | 0 | 0 | 0 | 1 | 0 | 1 | 1 | 1 | 1 | 0 | 1 | 0 | | | | |
| 277–322 | 0 | 0 | 0 | 1 | 1 | 0 | 1 | 1 | 1 | 0 | 0 | 1 | | | | |
| 323–368 | 0 | 0 | 0 | 1 | 1 | 1 | 1 | 1 | 1 | 0 | 0 | 0 | | | | |
| 369–414 | 0 | 0 | 1 | 0 | 0 | 0 | 1 | 1 | 0 | 1 | 1 | 1 | | | | |
| 415–460 | 0 | 0 | 1 | 0 | 0 | 1 | 1 | 1 | 0 | 1 | 1 | 0 | | | | |
| 461–506 | 0 | 0 | 1 | 0 | 1 | 0 | 1 | 1 | 0 | 1 | 0 | 1 | | | | |
| 507–552 | 0 | 0 | 1 | 0 | 1 | 1 | 1 | 1 | 0 | 1 | 0 | 0 | | | | |
| 553–598 | 0 | 0 | 1 | 1 | 0 | 0 | 1 | 1 | 0 | 0 | 1 | 1 | | | | |
| 599–644 | 0 | 0 | 1 | 1 | 0 | 1 | 1 | 1 | 0 | 0 | 1 | 0 | | | | |
| 645–690 | 0 | 0 | 1 | 1 | 1 | 0 | 1 | 1 | 0 | 0 | 0 | 1 | | | | |
| 691–736 | 0 | 0 | 1 | 1 | 1 | 1 | 1 | 1 | 0 | 0 | 0 | 0 | | | | |
| 737–782 | 0 | 1 | 0 | 0 | 0 | 0 | 1 | 0 | 1 | 1 | 1 | 1 | | | | |
| 783–828 | 0 | 1 | 0 | 0 | 0 | 1 | 1 | 0 | 1 | 1 | 1 | 0 | | | | |
| 829–874 | 0 | 1 | 0 | 0 | 1 | 0 | 1 | 0 | 1 | 1 | 0 | 1 | | | | |
| 875–920 | 0 | 1 | 0 | 0 | 1 | 1 | 1 | 0 | 1 | 1 | 0 | 0 | | | | |
| 921–966 | 0 | 1 | 0 | 1 | 0 | 0 | 1 | 0 | 1 | 0 | 1 | 1 | | | | |
| 967–1012 | 0 | 1 | 0 | 1 | 0 | 1 | 1 | 0 | 1 | 0 | 1 | 0 | | | | |
| 1013–1058 | 0 | 1 | 0 | 1 | 1 | 0 | 1 | 0 | 1 | 0 | 0 | 1 | | | | |
| 1059–1104 | 0 | 1 | 0 | 1 | 1 | 1 | 1 | 0 | 1 | 0 | 0 | 0 | | | | |
| 1105–1150 | 0 | 1 | 1 | 0 | 0 | 0 | 1 | 0 | 0 | 1 | 1 | 1 | | | | |
| 1151–1196 | 0 | 1 | 1 | 0 | 0 | 1 | 1 | 0 | 0 | 1 | 1 | 0 | | | | |
| 1197–1242 | 0 | 1 | 1 | 0 | 1 | 0 | 1 | 0 | 0 | 1 | 0 | 1 | | | | |
| 1243–1288 | 0 | 1 | 1 | 0 | 1 | 1 | 1 | 0 | 0 | 1 | 0 | 0 | | | | |
| 1289–1334 | 0 | 1 | 1 | 1 | 0 | 0 | 1 | 0 | 0 | 0 | 1 | 1 | | | | |
| 1335–1380 | 0 | 1 | 1 | 1 | 0 | 1 | 1 | 0 | 0 | 0 | 1 | 0 | | | | |
| 1381–1426 | 0 | 1 | 1 | 1 | 1 | 0 | 1 | 0 | 0 | 0 | 0 | 1 | | | | |
| 1427–1472 | 0 | 1 | 1 | 1 | 1 | 1 | 1 | 0 | 0 | 0 | 0 | 0 | | | | |
| 1473–1518 | 1 | 0 | 0 | 0 | 0 | 0 | 0 | 1 | 1 | 1 | 1 | 1 | | | | |
| 1519–1564 | 1 | 0 | 0 | 0 | 0 | 1 | 0 | 1 | 1 | 1 | 1 | 0 | | | | |
| 1565–1610 | 1 | 0 | 0 | 0 | 1 | 0 | 0 | 1 | 1 | 1 | 0 | 1 | | | | |
| 1611–1656 | 1 | 0 | 0 | 0 | 1 | 1 | 0 | 1 | 1 | 1 | 0 | 0 | | | | |
| 1657–1702 | 1 | 0 | 0 | 1 | 0 | 0 | 0 | 1 | 1 | 0 | 1 | 1 | | | | |
| 1703–1748 | 1 | 0 | 0 | 1 | 0 | 1 | 0 | 1 | 1 | 0 | 1 | 0 | | | | |
| 1749–1794 | 1 | 0 | 0 | 1 | 1 | 0 | 0 | 1 | 1 | 0 | 0 | 1 | | | | |
| 1795–1840 | 1 | 0 | 0 | 1 | 1 | 1 | 0 | 1 | 1 | 0 | 0 | 0 | | | | |

TABLE 2B

| NUM | I01 | I02 | I03 | I04 | I05 | I06 | I07 | I08 | I09 | I10 | I11 | I12 | I13 | I14 | I15 | I16 | I17 | I18 | I19 | I20 | I21 | I22 |
|---|---|---|---|---|---|---|---|---|---|---|---|---|---|---|---|---|---|---|---|---|---|---|
| 1 | 0 | 1 | 1 | 1 | 1 | 1 | 1 | 1 | 1 | 1 | 1 | 1 | 1 | 1 | 1 | 1 | 1 | 1 | 1 | 1 | 1 | 1 |
| 2 | 1 | 1 | 1 | 1 | 1 | 1 | 1 | 1 | 1 | 1 | 1 | 1 | 1 | 1 | 1 | 1 | 1 | 1 | 1 | 1 | 1 | 1 |
| 3 | 1 | 0 | 1 | 1 | 1 | 1 | 1 | 1 | 1 | 1 | 1 | 1 | 1 | 1 | 1 | 1 | 1 | 1 | 1 | 1 | 1 | 1 |
| 4 | 1 | 1 | 1 | 1 | 1 | 1 | 1 | 1 | 1 | 1 | 1 | 1 | 1 | 1 | 1 | 1 | 1 | 1 | 1 | 1 | 1 | 1 |
| 5 | 1 | 1 | 0 | 1 | 1 | 1 | 1 | 1 | 1 | 1 | 1 | 1 | 1 | 1 | 1 | 1 | 1 | 1 | 1 | 1 | 1 | 1 |
| 6 | 1 | 1 | 1 | 1 | 1 | 1 | 1 | 1 | 1 | 1 | 1 | 1 | 1 | 1 | 1 | 1 | 1 | 1 | 1 | 1 | 1 | 1 |
| 7 | 1 | 1 | 1 | 0 | 1 | 1 | 1 | 1 | 1 | 1 | 1 | 1 | 1 | 1 | 1 | 1 | 1 | 1 | 1 | 1 | 1 | 1 |
| 8 | 1 | 1 | 1 | 1 | 1 | 1 | 1 | 1 | 1 | 1 | 1 | 1 | 1 | 1 | 1 | 1 | 1 | 1 | 1 | 1 | 1 | 1 |
| 9 | 1 | 1 | 1 | 1 | 0 | 1 | 1 | 1 | 1 | 1 | 1 | 1 | 1 | 1 | 1 | 1 | 1 | 1 | 1 | 1 | 1 | 1 |
| 10 | 1 | 1 | 1 | 1 | 1 | 1 | 1 | 1 | 1 | 1 | 1 | 1 | 1 | 1 | 1 | 1 | 1 | 1 | 1 | 1 | 1 | 1 |
| 11 | 1 | 1 | 1 | 1 | 1 | 0 | 1 | 1 | 1 | 1 | 1 | 1 | 1 | 1 | 1 | 1 | 1 | 1 | 1 | 1 | 1 | 1 |
| 12 | 1 | 1 | 1 | 1 | 1 | 1 | 1 | 1 | 1 | 1 | 1 | 1 | 1 | 1 | 1 | 1 | 1 | 1 | 1 | 1 | 1 | 1 |
| 13 | 1 | 1 | 1 | 1 | 1 | 1 | 0 | 1 | 1 | 1 | 1 | 1 | 1 | 1 | 1 | 1 | 1 | 1 | 1 | 1 | 1 | 1 |
| 14 | 1 | 1 | 1 | 1 | 1 | 1 | 1 | 1 | 1 | 1 | 1 | 1 | 1 | 1 | 1 | 1 | 1 | 1 | 1 | 1 | 1 | 1 |
| 15 | 1 | 1 | 1 | 1 | 1 | 1 | 1 | 0 | 1 | 1 | 1 | 1 | 1 | 1 | 1 | 1 | 1 | 1 | 1 | 1 | 1 | 1 |
| 16 | 1 | 1 | 1 | 1 | 1 | 1 | 1 | 1 | 1 | 1 | 1 | 1 | 1 | 1 | 1 | 1 | 1 | 1 | 1 | 1 | 1 | 1 |
| 17 | 1 | 1 | 1 | 1 | 1 | 1 | 1 | 1 | 0 | 1 | 1 | 1 | 0 | 1 | 1 | 1 | 1 | 1 | 1 | 1 | 1 | 1 |
| 18 | 1 | 1 | 1 | 1 | 1 | 1 | 1 | 1 | 1 | 1 | 1 | 1 | 1 | 1 | 1 | 1 | 1 | 1 | 1 | 1 | 1 | 1 |
| 19 | 1 | 1 | 1 | 1 | 1 | 1 | 1 | 1 | 1 | 0 | 1 | 1 | 1 | 1 | 1 | 1 | 1 | 1 | 1 | 1 | 1 | 1 |
| 20 | 1 | 1 | 1 | 1 | 1 | 1 | 1 | 1 | 1 | 1 | 1 | 1 | 1 | 1 | 1 | 1 | 1 | 1 | 1 | 1 | 1 | 1 |
| 21 | 1 | 1 | 1 | 1 | 1 | 1 | 1 | 1 | 1 | 1 | 0 | 1 | 1 | 1 | 1 | 1 | 1 | 1 | 1 | 1 | 1 | 1 |
| 22 | 1 | 1 | 1 | 1 | 1 | 1 | 1 | 1 | 1 | 1 | 1 | 1 | 1 | 1 | 1 | 1 | 1 | 1 | 1 | 1 | 1 | 1 |
| 23 | 1 | 1 | 1 | 1 | 1 | 1 | 1 | 1 | 1 | 1 | 1 | 0 | 1 | 1 | 1 | 1 | 1 | 1 | 1 | 1 | 1 | 1 |
| 24 | 1 | 1 | 1 | 1 | 1 | 1 | 1 | 1 | 1 | 1 | 1 | 1 | 1 | 1 | 1 | 1 | 1 | 1 | 1 | 1 | 1 | 1 |
| 25 | 1 | 1 | 1 | 1 | 1 | 1 | 1 | 1 | 1 | 1 | 1 | 1 | 0 | 1 | 1 | 1 | 1 | 1 | 1 | 1 | 1 | 1 |
| 26 | 1 | 1 | 1 | 1 | 1 | 1 | 1 | 1 | 1 | 1 | 1 | 1 | 1 | 1 | 1 | 1 | 1 | 1 | 1 | 1 | 1 | 1 |
| 27 | 1 | 1 | 1 | 1 | 1 | 1 | 1 | 1 | 1 | 1 | 1 | 1 | 1 | 0 | 1 | 1 | 1 | 1 | 1 | 1 | 1 | 1 |
| 28 | 1 | 1 | 1 | 1 | 1 | 1 | 1 | 1 | 1 | 1 | 1 | 1 | 1 | 1 | 1 | 1 | 1 | 1 | 1 | 1 | 1 | 1 |
| 29 | 1 | 1 | 1 | 1 | 1 | 1 | 1 | 1 | 1 | 1 | 1 | 1 | 1 | 1 | 0 | 1 | 1 | 1 | 1 | 1 | 1 | 1 |
| 30 | 1 | 1 | 1 | 1 | 1 | 1 | 1 | 1 | 1 | 1 | 1 | 1 | 1 | 1 | 1 | 1 | 1 | 1 | 1 | 1 | 1 | 1 |

TABLE 2B-continued

| NUM | 11 | 12 | 13 | 14 | 15 | 16 | 17 | 18 | 19 | 110 | 111 | 112 | 113 | 114 | 115 | 116 | 117 | 118 | 119 | 120 | 121 | 122 |
|---|---|---|---|---|---|---|---|---|---|---|---|---|---|---|---|---|---|---|---|---|---|---|
| 31 | 1 | 1 | 1 | 1 | 1 | 1 | 1 | 1 | 1 | 1 | 1 | 1 | 1 | 1 | 0 | 1 | 1 | 1 | 1 | 1 | 1 | 1 |
| 32 | 1 | 1 | 1 | 1 | 1 | 1 | 1 | 1 | 1 | 1 | 1 | 1 | 1 | 1 | 1 | 1 | 1 | 1 | 1 | 1 | 1 | 1 |
| 33 | 1 | 1 | 1 | 1 | 1 | 1 | 1 | 1 | 1 | 1 | 1 | 1 | 1 | 1 | 1 | 0 | 1 | 1 | 1 | 1 | 1 | 1 |
| 34 | 1 | 1 | 1 | 1 | 1 | 1 | 1 | 1 | 1 | 1 | 1 | 1 | 1 | 1 | 1 | 1 | 1 | 1 | 1 | 1 | 1 | 1 |
| 35 | 1 | 1 | 1 | 1 | 1 | 1 | 1 | 1 | 1 | 1 | 1 | 1 | 1 | 1 | 1 | 0 | 1 | 1 | 1 | 1 | 1 | 1 |
| 36 | 1 | 1 | 1 | 1 | 1 | 1 | 1 | 1 | 1 | 1 | 1 | 1 | 1 | 1 | 1 | 1 | 1 | 1 | 1 | 1 | 1 | 1 |
| 37 | 1 | 1 | 1 | 1 | 1 | 1 | 1 | 1 | 1 | 1 | 1 | 1 | 1 | 1 | 1 | 1 | 0 | 1 | 1 | 1 | 1 | 1 |
| 38 | 1 | 1 | 1 | 1 | 1 | 1 | 1 | 1 | 1 | 1 | 1 | 1 | 1 | 1 | 1 | 1 | 1 | 1 | 1 | 1 | 1 | 1 |
| 39 | 1 | 1 | 1 | 1 | 1 | 1 | 1 | 1 | 1 | 1 | 1 | 1 | 1 | 1 | 1 | 1 | 1 | 0 | 1 | 1 | 1 | 1 |
| 40 | 1 | 1 | 1 | 1 | 1 | 1 | 1 | 1 | 1 | 1 | 1 | 1 | 1 | 1 | 1 | 1 | 1 | 1 | 1 | 1 | 1 | 1 |
| 41 | 1 | 1 | 1 | 1 | 1 | 1 | 1 | 1 | 1 | 1 | 1 | 1 | 1 | 1 | 1 | 1 | 1 | 1 | 1 | 0 | 1 | 1 |
| 42 | 1 | 1 | 1 | 1 | 1 | 1 | 1 | 1 | 1 | 1 | 1 | 1 | 1 | 1 | 1 | 1 | 1 | 1 | 1 | 1 | 1 | 1 |
| 43 | 1 | 1 | 1 | 1 | 1 | 1 | 1 | 1 | 1 | 1 | 1 | 1 | 1 | 1 | 1 | 1 | 1 | 1 | 1 | 1 | 1 | 0 |
| 44 | 1 | 1 | 1 | 1 | 1 | 1 | 1 | 1 | 1 | 1 | 1 | 1 | 1 | 1 | 1 | 1 | 1 | 1 | 1 | 1 | 1 | 1 |

What is claimed is:

1. A dynamically testable programmable circuit array having a plurality of input terminals, each input terminal adapted to receive one of a plurality of input signals, comprising:

(a) input buffer means, having a plurality of output terminals and inverted output terminals, said input buffer means operatively connected to said input terminals, for outputting equivalent input signals and inverted input signals, said equivalent input signals forming a first output group and said inverted input signals forming a second output group;

(b) programmable product array means, operatively connected to the output terminals and the inverted output terminals of said input buffer means thereby receiving said equivalent input signals and said inverted input signals, for generating a plurality of product terms;

(c) programmable sum array means, operatively connected to said programmable product array means, for combining said plurality of product terms to generate a plurality of sum terms, each of said plurality of sum terms being an output of said dynamically testable programmable circuit array; and (d) test means, having a first and second control input terminal adapted to receive a first and second control signal, operatively coupled to the output terminals of said input buffer means, for causing one of said output groups to have a predetermined logic state, said test means including;

(i) a plurality of first circuit component means, each of said first circuit component means operatively connected to a respective output terminal and inverted output terminal of said input buffer means, and further, each of said first circuit component means which is operatively connected to a respective output terminal of said input buffer means being operatively connected to said first control input terminal, and each of said first circuit component means which is operatively connected to a respective inverted output terminal of said input buffer means being operatively connected to said second control input terminal, for causing each of said output terminals and each of said inverted output terminals of said input buffer means to be forced to a first predetermined logic level in response to said first and second control signals, respectively; and (ii) second circuit component means, operatively connected to one of said control input terminals, for forcing a second predetermined logic level to the respective control input terminal in the absence of the respective control signals, said second predetermined logic level partially enabling the respective inputs of said programmable product array means.

2. A dynamically testable programmable circuit array, according to claim 1, wherein said programmable product means comprises: a plurality of AND gates, each AND gate having a plurality of input terminals for receiving the respective equivalent input signal and respective inverted input signal, each input terminal of each of said plurality of AND gates having associated therewith a fusible link, the output terminal of each AND gate yielding a product term.

3. A dynamically testable programmable circuit array according to claim 2, wherein said programmable product means comprises: a plurality of AND gates, each AND gate having a plurality of input terminals for receiving at least one equivalent input signal, or at least one inverted input signal, each input terminal of each of said plurality of AND gates having associated therewith a fusible link, the output terminal of each AND gate yielding a product term.

4. A dynamically testable programmable circuit array according to claim 3, wherein said programmable sum array means comprises: a plurality of OR gates, each OR gate having a plurality of input terminals for receiving the respective product term, and each input terminal of said plurality of OR gates having associated therewith a fusible link, the output of each OR gate being the outputs of said programmable circuit array.

5. A dynamically testable programmable circuit array according to claim 4, further comprising programmable selective logic means for providing the output signal in a normal state or in an inverted state.

6. A dynamically testable programmable circuit array according to claim 5 wherein said programmable selective logic means comprises a plurality of exclusive OR circuits wherein a first input of each of said exclusive OR circuits is coupled to the respective output signal and a second input of each of said exclusive OR circuit having a fusible link coupled to a predetermined logic level.

* * * * *